United States Patent
Tabat

(10) Patent No.: US 8,202,435 B2
(45) Date of Patent: Jun. 19, 2012

(54) METHOD FOR SELECTIVELY ETCHING AREAS OF A SUBSTRATE USING A GAS CLUSTER ION BEAM

(75) Inventor: Martin D. Tabat, Nashua, NH (US)

(73) Assignee: TEL Epion Inc., Billerica, MA (US)

( * ) Notice: Subject to any disclaimer, the term of this patent is extended or adjusted under 35 U.S.C. 154(b) by 992 days.

(21) Appl. No.: 12/184,517

(22) Filed: Aug. 1, 2008

(65) Prior Publication Data
US 2010/0025365 A1     Feb. 4, 2010

(51) Int. Cl.
*H01L 21/302* (2006.01)
(52) U.S. Cl. ........... 216/13; 216/37; 216/58; 216/74; 216/79; 438/694; 438/706
(58) Field of Classification Search .............. None
See application file for complete search history.

(56) References Cited

U.S. PATENT DOCUMENTS

| | | | |
|---|---|---|---|
| 4,361,762 A | 11/1982 | Douglas | |
| 4,564,533 A | 1/1986 | Yamazaki | |
| 4,740,267 A | 4/1988 | Knauer et al. | |
| 4,794,064 A | 12/1988 | Yamazaki et al. | |
| 4,886,971 A | 12/1989 | Matsumura et al. | |
| 4,916,311 A | 4/1990 | Fuzishita et al. | |
| 5,068,152 A | 11/1991 | Maro et al. | |
| 5,094,879 A | 3/1992 | Matsuda et al. | |
| 5,907,780 A | 5/1999 | Gilmer et al. | |
| 6,750,460 B2 | 6/2004 | Greer | |
| 6,812,147 B2 * | 11/2004 | Skinner et al. | 438/690 |
| 7,259,036 B2 | 8/2007 | Borland et al. | |
| 7,288,491 B2 | 10/2007 | Collins et al. | |
| 7,323,411 B1 | 1/2008 | Blosse | |
| 7,794,798 B2 | 9/2010 | Hautala | |
| 7,838,428 B2 * | 11/2010 | Chen et al. | 438/700 |
| 2002/0068128 A1 | 6/2002 | Akizuki et al. | |
| 2002/0130275 A1 | 9/2002 | Mack et al. | |
| 2005/0181621 A1 | 8/2005 | Borland et al. | |
| 2005/0272237 A1 * | 12/2005 | Hautala et al. | 438/597 |

(Continued)

FOREIGN PATENT DOCUMENTS
JP    62296357 A    12/1987

(Continued)

OTHER PUBLICATIONS

U.S. Patent and Trademark Office, Non-final Office Action received in related U.S. Appl. No. 11/864,961 dated Nov. 5, 2009, 25 pp.

(Continued)

*Primary Examiner* — Anita Alanko
(74) *Attorney, Agent, or Firm* — Wood, Herron & Evans, LLP

(57) ABSTRACT

A method for selectively etching areas of a substrate is described. The method includes providing in a process chamber a substrate containing a first material having a film deposition surface and a second material having an etch surface. The method further includes forming a gas cluster ion beam (GCIB) from a pressurized gas containing a deposition-etch gas, and exposing the substrate to the GCIB to remove at least a portion of the second material from the etch surface and deposit a thin film on the film deposition surface of the first material. According to some embodiments, the deposition-etch gas may contain silicon (Si) and carbon (C), and it may possess a Si—C bond.

23 Claims, 9 Drawing Sheets

U.S. PATENT DOCUMENTS

| | | | |
|---|---|---|---|
| 2006/0093753 A1 | 5/2006 | Nickel | |
| 2006/0105570 A1* | 5/2006 | Hautala et al. | 438/687 |
| 2006/0205193 A1 | 9/2006 | Sugimoto et al. | |
| 2007/0087034 A1 | 4/2007 | Blinn et al. | |
| 2007/0117342 A1* | 5/2007 | Chen et al. | 438/401 |
| 2008/0142735 A1 | 6/2008 | Chandler et al. | |
| 2009/0087579 A1 | 4/2009 | Hautala | |
| 2010/0193708 A1 | 8/2010 | Tabat et al. | |
| 2010/0193898 A1 | 8/2010 | Hautala et al. | |
| 2010/0200774 A1 | 8/2010 | Burke et al. | |
| 2010/0243919 A1 | 9/2010 | Hautala et al. | |
| 2010/0243920 A1 | 9/2010 | Hautala et al. | |

FOREIGN PATENT DOCUMENTS

| | | |
|---|---|---|
| JP | 08316231 | 11/1996 |
| WO | 2009045740 A2 | 4/2009 |

OTHER PUBLICATIONS

Isao Yamada et al., Materials processing by gas cluster ion beams, Materials Science and Engineering, Reports: A Review Journal, R34, (2001), pp. 231-295.

U.S. Patent and Trademark Office, Non-final Office Action received in related U.S. Appl. No. 11/864,330 dated Aug. 16, 2010, 31 pp.

European Patent Office, International Search Report and Written Opinion received in related International Patent Application No. PCT/US2008/076782 dated Dec. 12, 2008, 12 pp.

European Patent Office, Invitation to Pay Additional Fees and Partial International Search received in corresponding International Application No. PCT/US2008/076818 dated Mar. 17, 2009, 5 pp.

European Patent Office, International Search Report and Written Opinion received in corresponding International Application No. PCT/US2008/076818 dated May 15, 2009, 15 pp.

European Patent Office, International Search Report and Written Opionion received in corresponding International Application No. PCT/US2009/036275 dated Sep. 24, 2009, 14 pp.

Borland et al., Doping and deposition, Solid State Technology, May 2004, pp. 114-117.

U.S. Patent and Trademark Office, Final Office Action received in related U.S. Appl. No. 11/864,961 dated Mar. 25, 2010, 15 pp.

Saitoh, Y. et al, Acceleration of cluster and molecular ions by TIARA 3 MV tandem accelerator, vol. 452, No. 1-2, Sep. 21, 2000, pp. 61-66, XP004210610, ISSN: 0168-9002.

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

U.S. Patent and Trademark Office, Final Office Action issued in related U.S. Appl. No. 11/864,330 dated Jan. 5, 2011, 16 pg.

Yamada, I. et al., Gas Cluster Ion Beam Processing for ULSI Fabrication, Mat. Res. Soc. Symp. Proc. vol. 427, pp. 265-276, 1996 (no month).

U.S. Patent and Trademark Office, Non-final Office Action received in related U.S. Appl. No. 12/049,583 dated Oct. 13, 2010, 27 pp.

\* cited by examiner

METHOD FOR SELECTIVELY ETCHING AREAS OF A SUBSTRATE USING A GAS CLUSTER ION BEAM

CROSS-REFERENCE TO RELATED APPLICATIONS

This application is related to U.S. patent application Ser. No. 12/049,583, entitled "METHOD AND SYSTEM FOR DEPOSITING SILICON CARBIDE FILM USING A GAS CLUSTER ION BEAM", filed on Mar. 17, 2008, now abandoned. The entire content of this application is herein incorporated by reference.

FIELD OF INVENTION

The invention relates to a method for processing a substrate using a gas cluster ion beam (GCIB), and more particularly to a method for selectively etching areas of a substrate using a GCIB.

BACKGROUND OF THE INVENTION

Gas cluster ion beams (GCIBs) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, nitrous oxide, and mixtures of these gases.

Several emerging applications for GCIB processing of substrates on an industrial scale are in the semiconductor field. Although GCIB processing of a substrate is performed using a wide variety of gas cluster source gases, many of which are inert gases, many semiconductor processing applications use reactive source gases, sometimes in combination or mixture with inert or noble gases. Further development of GCIB processing with reactive source gases is needed.

SUMMARY OF THE INVENTION

The invention relates to a method for selectively etching areas of a substrate using a gas cluster ion beam (GCIB). According to embodiments of the invention, a substrate contains a first material having a film deposition surface where a thin film may be deposited by the GCIB and a second material having an etch surface that may be selectively etched by GCIB relative to the first material.

According to one embodiment of the invention, the method includes providing in a process chamber a substrate containing a first material having a film deposition surface and a second material having an etch surface; forming a gas cluster ion beam (GCIB) from a pressurized gas comprising a deposition-etch gas; and exposing the substrate to the GCIB to remove at least a portion of the second material from the etch surface and to deposit a thin film on the film deposition surface of the first material. According to some embodiments, the deposition-etch gas may contain silicon (Si) and carbon (C), and it may possess a Si—C bond.

According to another embodiment of the invention, the method includes providing in a process chamber a substrate containing a first material having a film deposition surface and a second material having an etch surface; selecting first gas cluster ion beam (GCIB) processing parameters for selectively etching the etch surface and for depositing a first film on the film deposition surface; forming a first GCIB from a pressurized gas comprising a deposition-etch gas using the first GCIB processing parameters; and exposing the substrate to the first GCIB using the first GCIB processing parameters to remove at least a portion of the second material from the etch surface and to deposit the first film on the film deposition surface of the first material. The method further includes selecting second GCIB processing parameters for non-selectively depositing an additional film on the substrate; forming a second GCIB using the second GCIB processing parameters; and exposing the substrate to the second GCIB using the second GCIB processing parameters to deposit the additional film on the substrate.

DETAILED DESCRIPTION OF SEVERAL EMBODIMENTS

Figure 1:
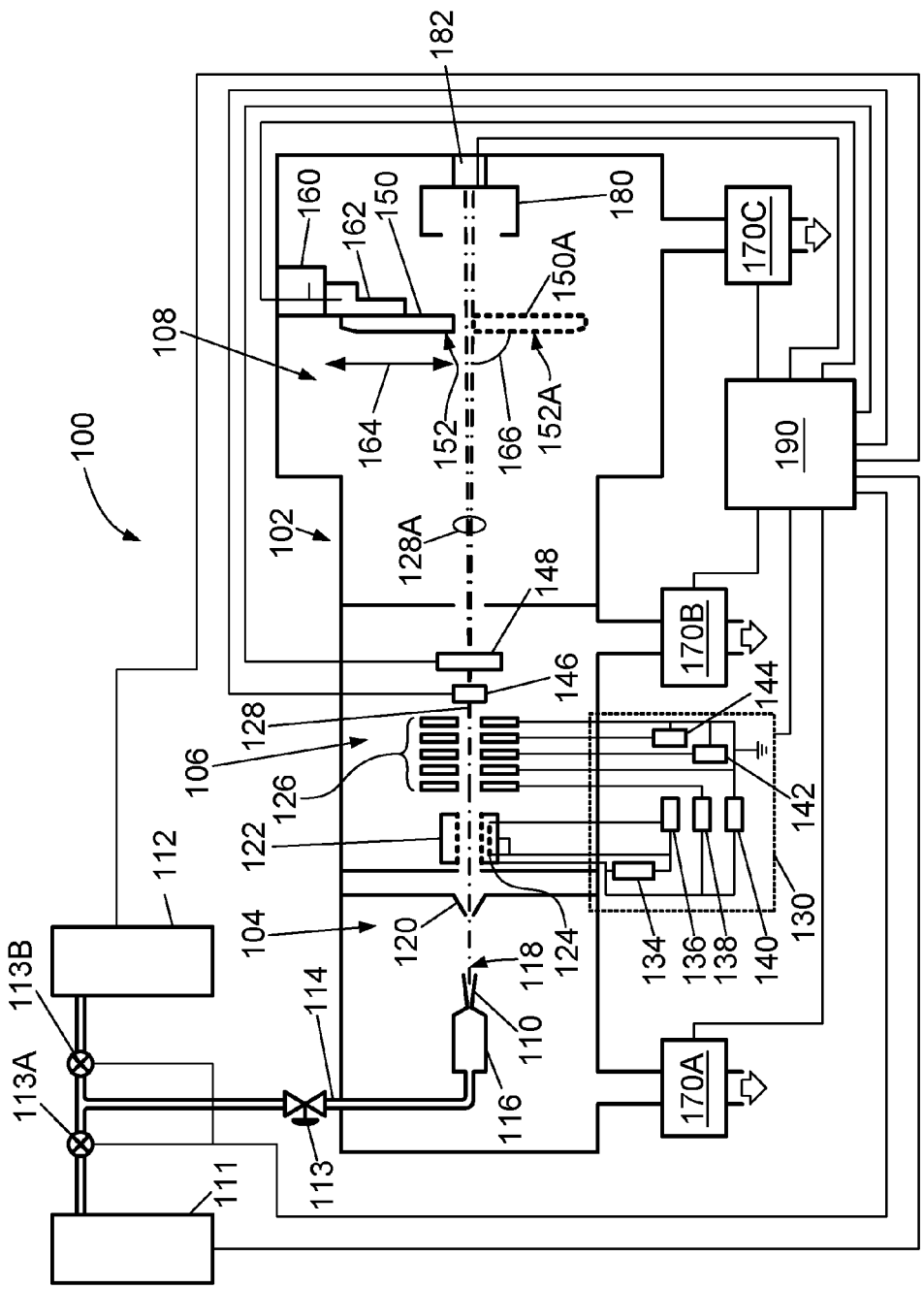
FIG. 1 is an illustration of a GCIB processing system.

A method and system for performing selective etching of areas of substrates using a gas cluster ion beam (GCIB) is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

There is a general need for selectively etching areas of substrates for semiconductor manufacturing. In particular, there is a general need for selective etching of different materials that are in close proximity to each other on a substrate (wafer). Previous GCIB approaches for etching substrates have traditionally involved either kinetically driven processes or chemically driven processes. In kinetically driven processes, gas cluster ions of inert gas species, such as argon (Ar), sputter a material from a substrate surface. In chemically driven processes, halogen-containing (e.g., containing $NF_3$) gas cluster ions deliver halogen atoms that etch the substrate surface by creating volatile species (e.g., fluorides) that remove the substrate material. One problem with these approaches is that neither of these processes is very selective if the materials are approximately the same density or composition. For example, etching of silicon-containing substrates or films using fluorine-based GCIB processing does not provide selective etching.

The inventors have discovered that for a wide variety of different substrate materials and film materials found in integrated circuits, a GCIB composition may be selected that forms a thin film on a film deposition surface of a first material but removes at least a portion of a second material from an etch surface of the substrate. According to some embodiments, the first material may be a SiCOH-containing dielectric material and the second material may be a non-SiCOH material. A GCIB composition may contain a deposition-etch gas containing silicon (Si) and carbon (C) and may possess a Si—C bond.

According to an embodiment of the invention, a GCIB processing system 100 is depicted in FIG. 1 comprising a vacuum vessel (process chamber) 102, substrate holder 150, upon which a substrate 152 to be processed is affixed and around which a reduced-pressure environment is maintained during substrate processing, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a gas cluster ion beam can be formed in the second chamber (ionization/acceleration chamber 106) wherein the gas cluster beam is ionized and accelerated. Then, in the third chamber (processing chamber 108), the accelerated gas cluster ion beam may be utilized to treat substrate 152.

As shown in FIG. 1, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Furthermore, for example, the first gas composition or the second gas composition or both can comprise a deposition-etch gas composition. Further yet, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The deposition-etch gas can comprise a film precursor or precursors that include the principal atomic or molecular species of the film desired to be produced on a film deposition area (surface) on the substrate. Additionally, the deposition-etch gas can include a reducing agent that assists with the reduction of a film precursor on a substrate. For instance, the reducing agent or agents may react with a part of or all of a film precursor on the substrate. Additionally yet, the film forming composition can include a polymerizing agent that may assist with the polymerization of a film precursor on the substrate.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 70 keV.

As illustrated in FIG. 1, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 1, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

The process GCIB 128A is accelerated from the ionization/acceleration chamber 106 into the reduced-pressure environment around the substrate holder 150 in processing chamber 108. A substrate 152, which may be a wafer or semiconductor wafer, a flat panel display (FPD), a liquid crystal display (LCD), or other substrate to be processed by GCIB processing, is held securely within the reduced-pressure environment and is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 1, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 2:
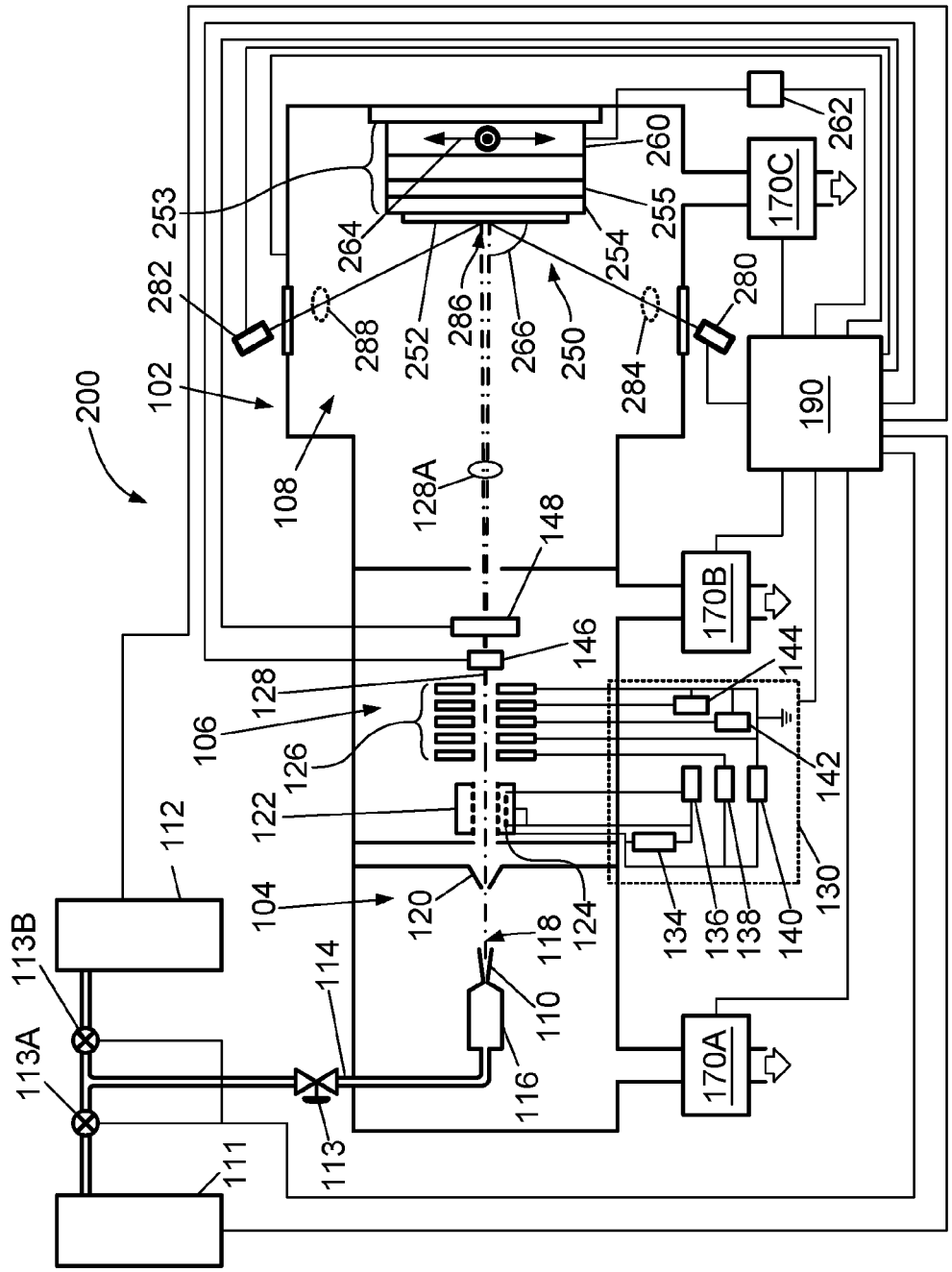
FIG. 2 is another illustration of a GCIB processing system.

In the embodiment shown in FIG. 2, the GCIB processing system 200 can be similar to the embodiment of FIG. 1 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the substrate 252 surface. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 200 by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the gas cluster ion beam with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 200. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Control system 190 comprises a microprocessor, memory, and a digital I/O port capable of generating control voltages sufficient to communicate and activate inputs to GCIB processing system 100 (or 200) a as well as monitor outputs from GCIB processing system 100 (or 200). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 200), or it can be remotely located relative to the GCIB processing system 100 (or 200). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 3:
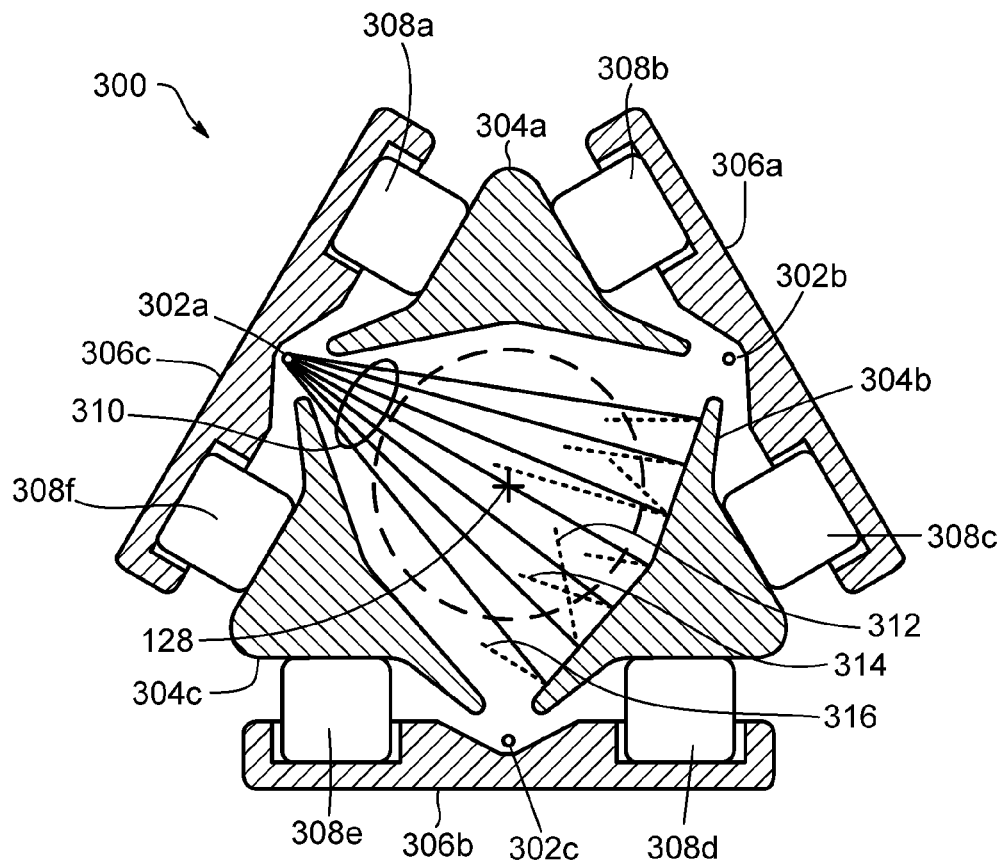
FIG. 3 is an illustration of an ionization source for a GCIB processing system.

Referring now to FIG. 3, a section 300 of a gas cluster ionizer (122, FIGS. 1 and 2) for ionizing a gas cluster jet (gas cluster beam 118, FIGS. 1 and 2) is shown. The section 300 is normal to the axis of GCIB 128. For typical gas cluster sizes (2000 to 15000 atoms), clusters leaving the skimmer aperture (120, FIGS. 1 and 2) and entering an ionizer (122, FIGS. 1 and 2) will travel with a kinetic energy of about 130 to 1000 electron volts (eV). At these low energies, any departure from space charge neutrality within the ionizer 122 will result in a rapid dispersion of the jet with a significant loss of beam current. FIG. 3 illustrates a self-neutralizing ionizer. As with other ionizers, gas clusters are ionized by electron impact. In this design, thermo-electrons (seven examples indicated by 310) are emitted from multiple linear thermionic filaments 302$a$, 302$b$, and 302$c$ (typically tungsten) and are extracted and focused by the action of suitable electric fields provided by electron-repeller electrodes 306a, 306b, and 306c and beam-forming electrodes 304a, 304b, and 304c. Thermoelectrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar.

According to an embodiment, GCIB processing is utilized to process substrates used in semiconductor manufacturing. In particular, a GCIB composition may be selected that forms a thin film on a film deposition surface of a first material of the substrate but removes at least a portion of a second material from an etch surface of the same substrate. According to some embodiments, a GCIB composition may contain a deposition-etch gas containing silicon (Si) and carbon (C) and may possess a Si—C bond. For example, the GCIB can be provided using either of the GCIB processing systems (100 or 200, or combinations thereof) depicted in FIGS. 1 and 2.

Figure 4A:
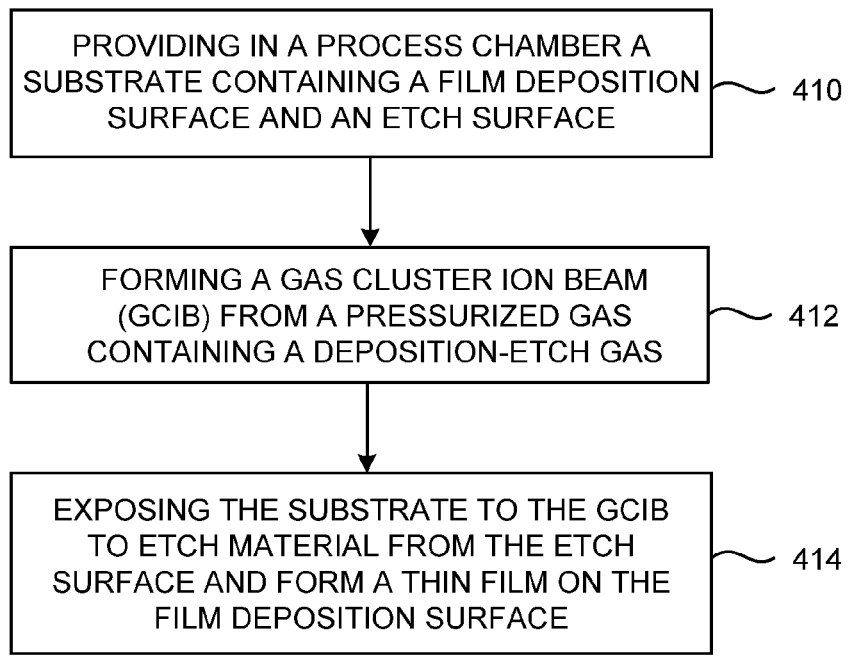
FIG. 4A illustrates a method of selectively etching an area of a substrate using a GCIB according to an embodiment of the invention.
Figure 4B:
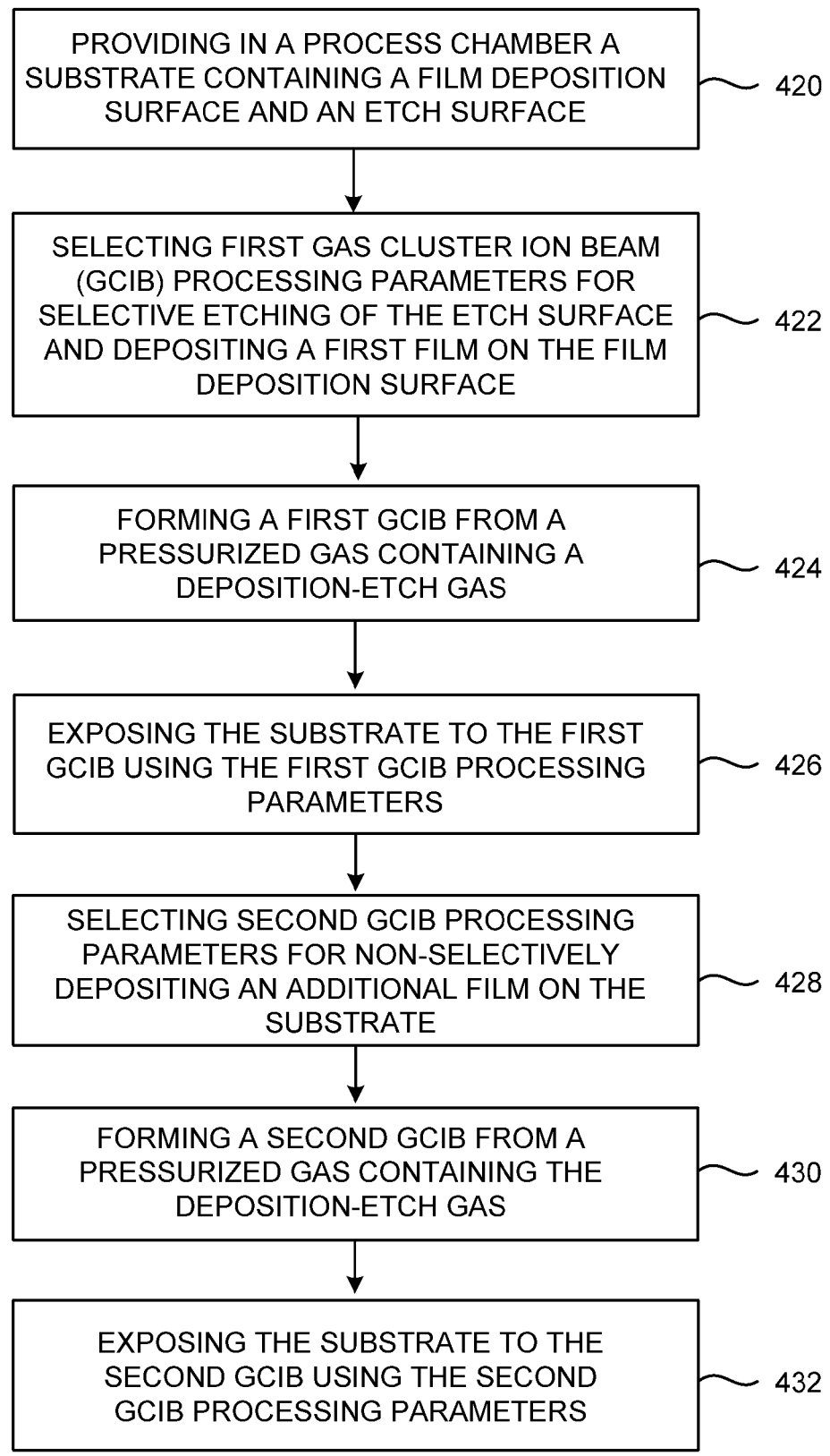
FIG. 4B illustrates a method of selectively etching an area of a substrate by GCIB followed by non-selectively depositing a film on the substrate by GCIB.

FIGS. 4A and 4B, which are flow diagrams, and FIGS. 5A-5F, which are schematic cross-sectional views, illustrate various embodiments of the method of the invention. Like reference numerals are used throughout the several views to refer to like parts.

FIG. 4A illustrates a method of selectively etching an area of a substrate using a GCIB according to an embodiment of the invention. Also referring to a cross-sectional view of a substrate in FIGS. 5A-5B, the method includes in 410, providing in a process chamber of a GCIB processing system a substrate 500 containing a first material 510 having a film deposition surface 510A and a second material 512 containing an etch surface 512A. In the embodiment shown, substrate 500 is planarized, such that film deposition surface 510A is co-planar with etch surface 512A, but this is not required. According to some embodiments of the invention, the first material 510 may be a SiCOH-containing dielectric material that is currently used extensively in semiconductor devices and the second material 512 may contain a non-SiCOH material. SiCOH-containing dielectric materials contain silicon (Si), carbon (C), oxygen (O), and hydrogen (H), and include SiCOH or F-doped SiCOH. Specific examples of materials of the composition Si, C, O, and H include, but are not limited to, Black Diamond™ from Applied Materials, Coral™ from Novellus Systems, and Aurora™ from ASM., all have k approximately 3.0, and include the range 2.8 to 3.2. Also, SiCOH-containing dielectric materials containing porosity and having k from 2.7 down to 1.8 may be used within embodiments of this invention, including BDII and BDIII from Applied Materials, Aurora ULK and ELK from ASM, and other porous SiCOH films. A variety of spin applied films having the composition Si, C, O, H, such as, methylsilsesquioxanes, siloxanes and 5109, 5117, 5525, 5530 from Japan Synthetic Rubber (JSR), and Dendriglass may also be used. The materials known as Orion™ and other materials from Trikon may also be used. The non-SiCOH materials may include silicon oxide ($SiO_2$ or $SiO_x$ (x<2)), silicon oxynitride ($SiO_xN_y$), germanium oxide ($GeO_2$ or $GeO_x$ (x<2)), germanium oxynitride ($GeO_xN_y$), single crystal silicon, polycrystalline silicon, amorphous silicon, silicon nitride ($Si_3N_4$ or $SiN_x$), silicon carbide (SiC), silicon carbonitride (SiCN), or other materials.

In 412, a GCIB 502 is formed from a pressurized gas containing a deposition-etch gas. According to some embodiments of the invention, the deposition-etch gas may contain a compound having silicon (Si) and carbon (C), where the Si and C may be present in the same molecule. Further, the compound may possess a Si—C bond. For example, the deposition-etch gas may comprise an alkyl silane, an alkane silane, an alkene silane, or an alkyne silane, or any combination of two or more thereof. Additionally, for example, the deposition-etch gas may include methylsilane ($H_3C$—$SiH_3$), dimethylsilane ($H_3C$—$SiH_2$—$CH_3$), trimethylsilane ($(CH_3)_3$—SiH), or tetramethylsilane ($(CH_3)_4$—Si), or any combination of two or more thereof. Several chemical formulations are provided below to illustrate the Si—C bond.

Methylsilane

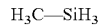

Dimethylsilane

Trimethylsilane

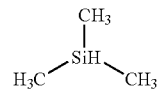

Additionally, for example, the pressurized gas may further include ethylsilane, diethylsilane, triethylsilane, or tetraethylsilane, or any combination of two or more thereof.

The pressurized gas may further comprise an inert gas, such as a noble gas, for example argon (Ar) or helium (He).

Additionally, the pressurized gas may further comprise a nitrogen-containing gas. For example, the nitrogen-containing gas may include $N_2$, $NH_3$, $NF_3$, NO, $N_2O$, or $NO_2$, or a combination of two or more thereof. The addition of a nitrogen-containing gas may permit forming a silicon carbonitride film (SiCN) with relatively high carbon content.

Additionally yet, the pressurized gas may further comprise a carbon-containing gas. For example, the carbon-containing gas may include CO, $CO_2$, a hydrocarbon-containing gas, a fluorocarbon-containing gas, or a hydrofluorocarbon-containing gas, or any combination of two or more thereof.

Furthermore, the pressurized gas may further comprise an oxygen-containing gas or a hydrogen-containing gas or both.

According to embodiments of the invention, the GCIB processing parameters in step 412 are selected for selective etching of second material 512 from the etch surface 512A and formation of a thin film 514 on the film deposition surface 510A. The GCIB processing parameters can include the type of deposition-etch gas, the additional use of an inert gas and/or additional reactant gas(es), GCIB dose, and GCIB acceleration voltage, for example.

Figure 5A:
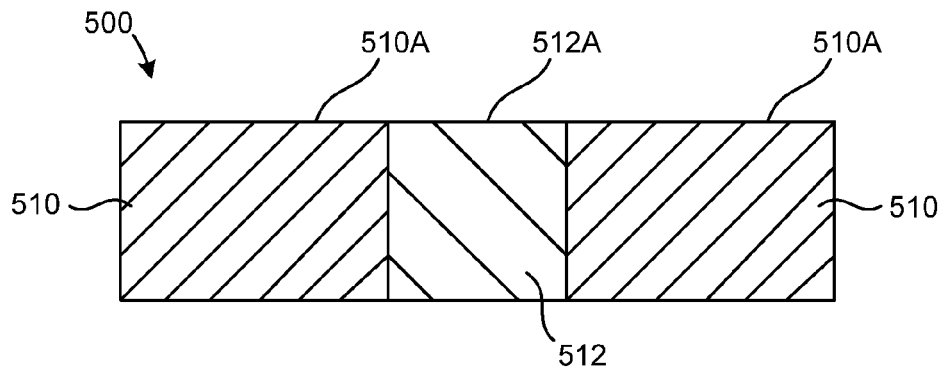
FIG. 5A is a cross-sectional view of a substrate containing an etch surface and a film deposition surface.
Figure 5B:
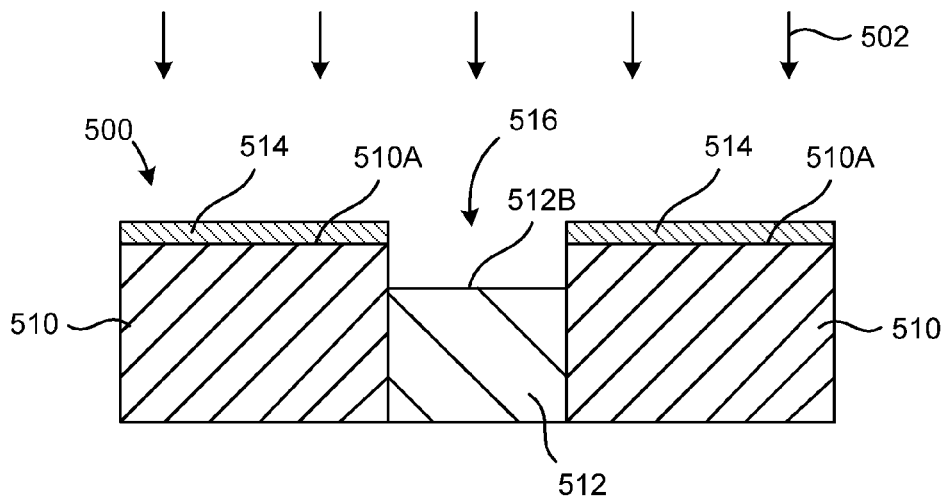
FIG. 5B is an illustration of the substrate in FIG. 5A after selective etching by GCIB processing.

In 414, the substrate 500 is exposed to GCIB 502 to remove at least a portion of the second material 512 from the etch surface 512A and deposit a thin film 514 on the film deposition surface 510A of the first material 510. As depicted in FIG. 5B, the impact of the multiple gas clusters in the GCIB 502 on the surfaces 510A and 512A selectively removes the second material 512 relative to the first material 510, thereby forming a recessed feature 516 in the second material 512 below the film deposition surface 510A. The recessed feature 516 has an etched surface 512B. Although not shown in FIG. 5B, the thin film 514 may also be present on the sidewalls of the recessed feature 516 formed by the GCIB processing. However, less deposition is expected on the sidewalls than on the film deposition surface 510A due to the anisotropic nature of the GCIB processing.

In one example, the substrate 500 may be a 300 mm Si wafer (having material structures thereon) and the GCIB 502 may be scanned onto at least a portion of the entire surface of the Si wafer. Additionally, the GCIB dose may be adjusted as a function of position on the surface of the wafer in order to vary selective etching over the entire surface of the wafer. The desired material removal by the etching may be achieved by selecting a GCIB dose. According to one embodiment of the invention, the deposition-etch gas in the GCIB 502 and the thin film 514 contain silicon (Si) and carbon (C). The thin film 514 may have a carbon content greater than or equal to about 10%, greater than about 20%, or greater than about 30%.

Figure 5C:
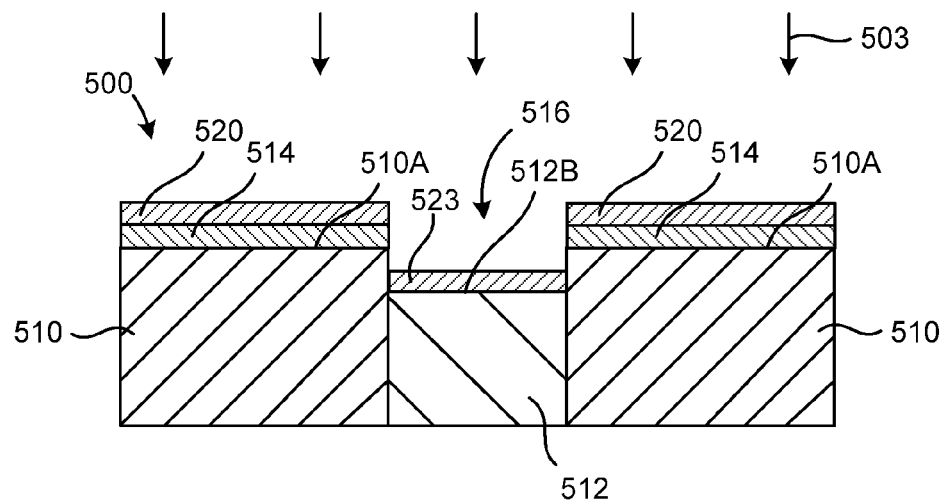
FIG. 5C is an illustration of the substrate in FIG. 5B after a non-selective film deposition by GCIB processing.

FIG. 5C is an illustration of the substrate 500 in FIG. 5B after further GCIB processing using GCIB 503 according to an embodiment of the invention. The further GCIB processing can include modifying the GCIB processing parameters selected in prior step 414 and exposing the substrate 500 in FIG. 5B to a GCIB 503 using the modified GCIB process parameters. The modified GCIB process parameters may be selected to provide non-selective film deposition on the substrate 500 in FIG. 5B. The modified GCIB processing parameters can include modified GCIB acceleration voltage, for example higher GCIB acceleration voltage. Exposure to the GCIB 503 non-selectively deposits film 523 on the etched surface 512B in the recessed feature 516 and film 520 on the thin film 514. As depicted in FIG. 5C, little or no film may be deposited on the sidewalls in the recessed feature 516 due to the anisotropic nature of the GCIB 503. According to one embodiment of the invention, the deposition-etch gas in the GCIB 503, the thin film 514, and films 523 and 520 contain silicon (Si) and carbon (C). The thin film 514 may have a carbon content greater than or equal to about 10%, greater than about 20%, or greater than about 30%.

FIG. 4B illustrates a method of selectively etching an area of a substrate 500 by GCIB followed by non-selectively depositing a film on the substrate 500 by GCIB. Referring additionally to FIGS. 5A-5C, the method includes in 420, providing in a process chamber a substrate 500 containing a first material 510 having a film deposition surface 510A and a second material 512 having an etch surface 512A. In 422, the method includes selecting first GCIB processing parameters for selective etching of the etch surface 512A and deposition of a first film 514 on the film deposition surface 510A. In 424, a first GCIB 502 is formed in accordance with the first GCIB processing parameters from a pressurized gas containing a deposition-etch gas, and in 426, the substrate 500 is exposed to the first GCIB 502 using the first GCIB processing parameters. In 428, the method includes selecting second GCIB processing parameters for non-selective deposition of an additional film 520 on the substrate 500. In 430, a second GCIB 503 is formed in accordance with the second GCIB processing parameters from a pressurized gas containing the deposition-etch gas, and in 432, the substrate 500 is exposed to the second GCIB 503 using the second GCIB processing parameters.

Figure 5D:
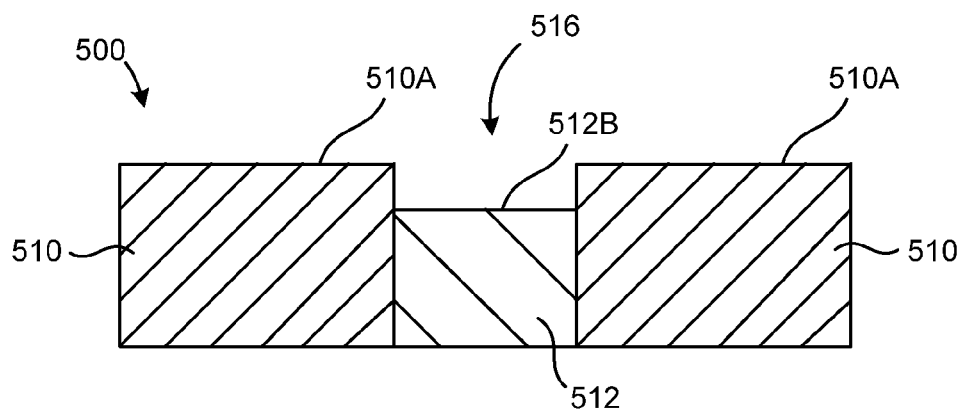
FIG. 5D is an illustration of the substrate in FIG. 5B after a film removal process.

FIG. 5D is an illustration of the substrate 500 in FIG. 5B after removal of the thin film 514 from the film deposition surface 510A prior to further GCIB processing. Removal processes for removing the thin film 514 are well known to those skilled in the art. In one example, removal of the thin film 514 may be performed using wet processing with water-based solutions, for example acids. In another example, the wet processing may utilize a combination of organic solvents and solutes. In yet another example, removal of the thin film 514 may be performed using dry processing, for example thermal or plasma-assisted processing in the presence of an etch gas (e.g., a halogen-containing gas). In another example, the dry processing may utilize GCIB processing. The GCIB may utilize Ar gas or a gas that selectively removes the thin film 514 from the first material 510 relative to the second material 512.

Figure 5E:
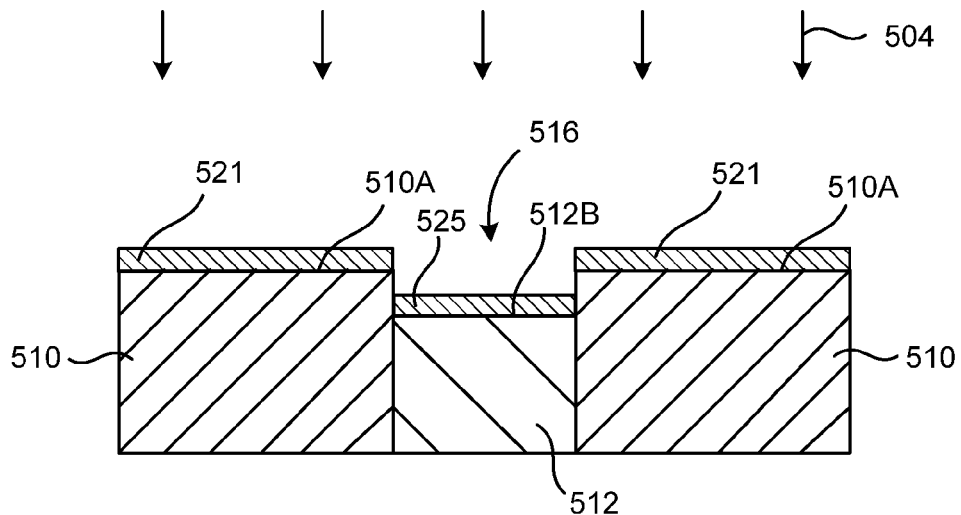
FIG. 5E is an illustration of the substrate in FIG. 5D after a non-selective film deposition by GCIB processing.

FIG. 5E is an illustration of the substrate 500 in FIG. 5D after a non-selective film deposition by further GCIB processing with a GCIB 504. The further GCIB processing can include using the modified GCIB processing parameters for GCIB 503 in FIG. 5C. Exposure to the GCIB 504 non-selectively deposits a film 525 on the etched surface 512B in the recessed feature 516 and film 521 on the film deposition surface 510A. As depicted in FIG. 5E, little or no film may be deposited on the sidewalls in the recessed feature 516 due to the anisotropic nature of the GCIB 504.

Figure 5F:
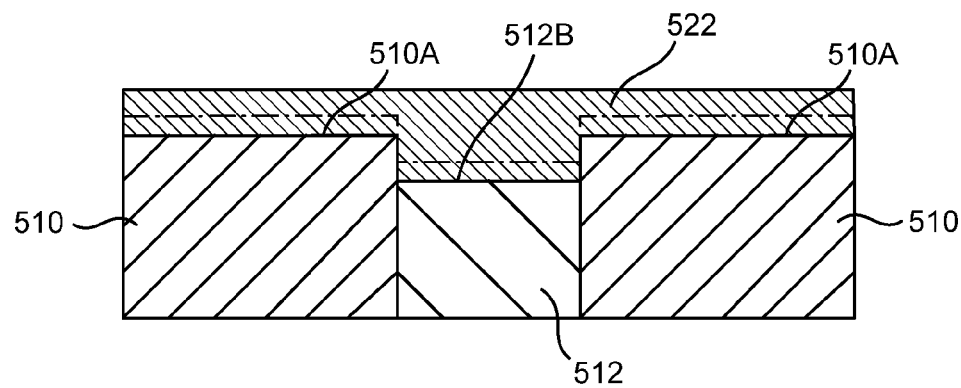
FIG. 5F is an illustration of the substrate in FIG. 5E after further a non-selective film deposition by GCIB processing.

FIG. 5F is an illustration of the substrate 500 in FIG. 5E after further non-selective film deposition by GCIB processing. The further non-selective GCIB processing may include longer exposure to the GCIB 504 described above in reference to FIG. 5E to fill the recessed feature 516 with a film 522.

Figure 6A:
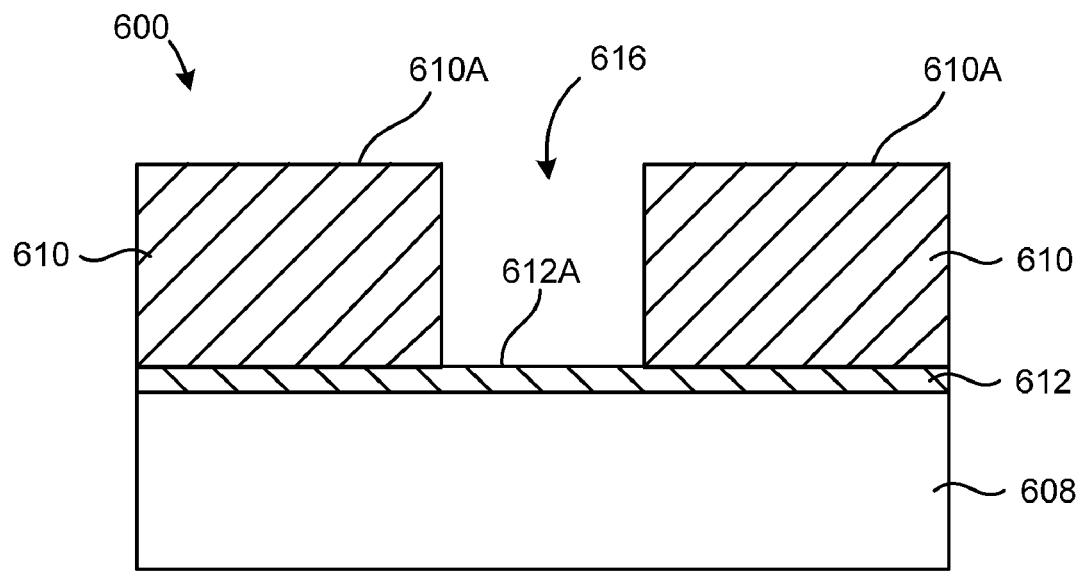
FIG. 6A is a cross-sectional view of a patterned substrate containing a recessed feature.

FIGS. 6A-6F, which are schematic cross-sectional views, illustrate various embodiments of the method of the invention. Like reference numerals are used throughout the several views to refer to like parts. FIG. 6A is a cross-sectional view of a patterned substrate 600 containing a recessed feature 616 according to one embodiment of the invention. The patterned substrate 600 contains a first material 610 having the recessed feature 616 formed therein and having a film deposition surface 610A, and a second material 612 having an etch surface 612A at the bottom of the recessed feature 616. According to some embodiments of the invention, the first material 610 may contain a SiCOH-containing dielectric material and the second material 612 may contain a non-SiCOH material. Examples of SiCOH-containing dielectric materials and non-SiCOH materials were described above in reference to FIGS. 4 and 5A-5B. In one example, the first material 610 may be a SiCOH dielectric material and the second material 612 may be an etch stop layer containing silicon nitride, silicon carbide, or silicon carbonitride.

Figure 6B:
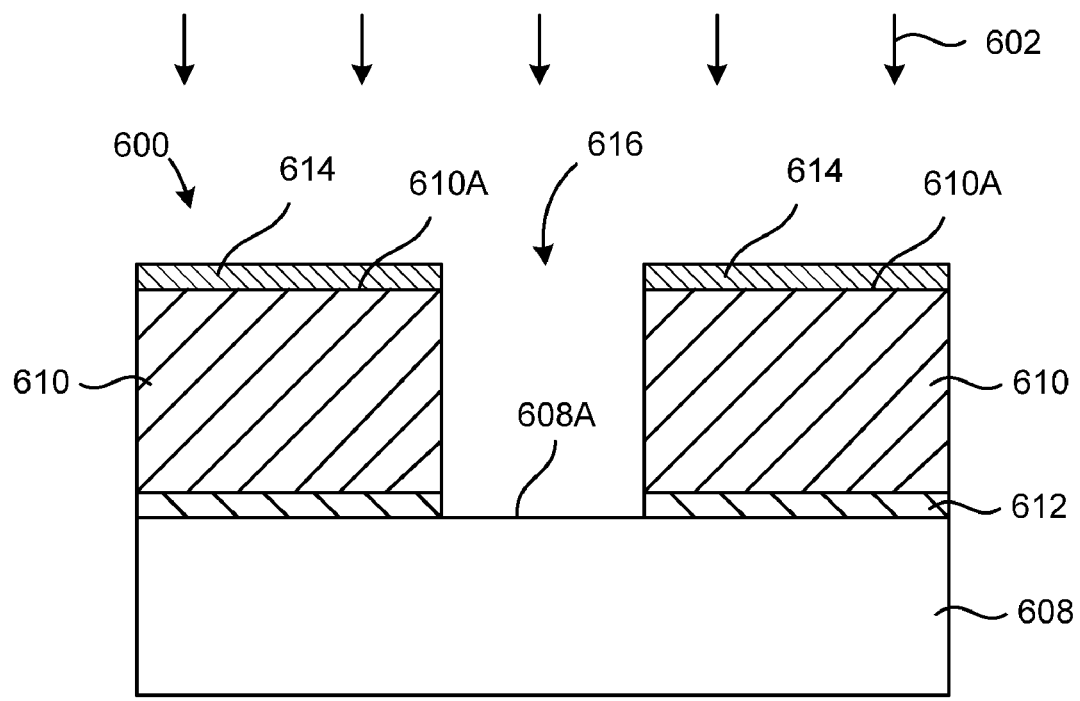
FIG. 6B is an illustration of the substrate in FIG. 6A after selective etching by GCIB processing.

FIG. 6B is an illustration of the patterned substrate 600 in FIG. 6A after GCIB processing by a GCIB 602 that etches the second material 612 and forms a thin film 614 on the film deposition surface 610A of the first material 610. As depicted in FIG. 6B, the impact of the multiple gas clusters in the GCIB 602 on the surfaces 610A and 612A selectively removes the second material 612 relative to the first material 610, thereby exposing a surface 608A in an underlying base material 608, referred to as "etched surface 608A" for consistency.

Although not shown in FIG. 6B, the thin film 614 may also be present on the sidewalls of the recessed feature 616. However, less deposition is expected on the sidewalls than on the film deposition surface 610A due to the anisotropic nature of the GCIB processing. According to one embodiment of the invention, deposition-etch gas in the GCIB 602 and the thin film 614 contain silicon (Si) and carbon (C). The thin film 614 may have a carbon content greater than or equal to about 10%, greater than about 20%, or greater than about 30%.

Figure 6C:
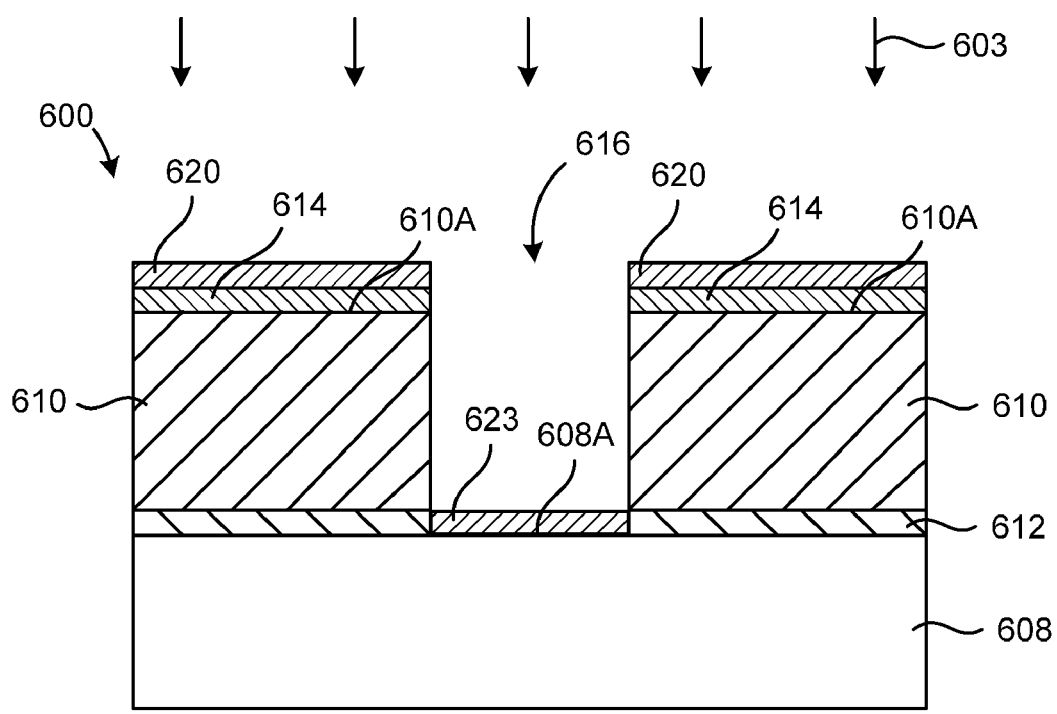
FIG. 6C is an illustration of the substrate in FIG. 6B after non-selective film deposition by GCIB processing.

FIG. 6C is an illustration of the patterned substrate 600 in FIG. 6B after further GCIB processing using a GCIB 603 according to an embodiment of the invention. The further GCIB processing can include modifying the GCIB processing parameters of the GCIB 602 and exposing the patterned substrate 600 in FIG. 6B to GCIB 603 using the modified GCIB process parameters. The modified GCIB process parameters may be selected to provide non-selective film deposition on the patterned substrate 600 in FIG. 6B. The modified GCIB processing parameters can include modified GCIB acceleration voltage, for example higher GCIB acceleration voltage. Exposure to the GCIB 603 non-selectively deposits a film 623 on the etched surface 608A in the recessed feature 616 and film 620 on the thin film 614. As depicted in FIG. 6C, little or no film may be deposited on the sidewalls in the recessed feature 616 due to the anisotropic nature of the GCIB 603.

Figure 6D:
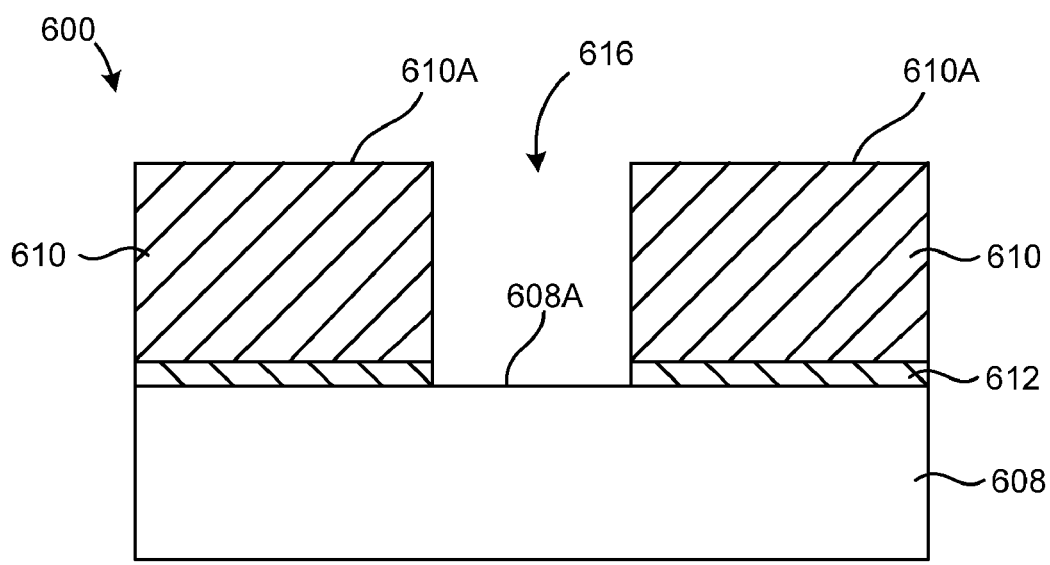
FIG. 6D is an illustration of the substrate in FIG. 6B after a film removal process.

FIG. 6D is an illustration of the patterned substrate 600 in FIG. 6B after optional removal of the thin film 614 from the film deposition surface 610A prior to further GCIB processing. Removal processes for removing the thin film 614 were described above in reference to removing the thin film 514 in FIG. 5B.

Figure 6E:
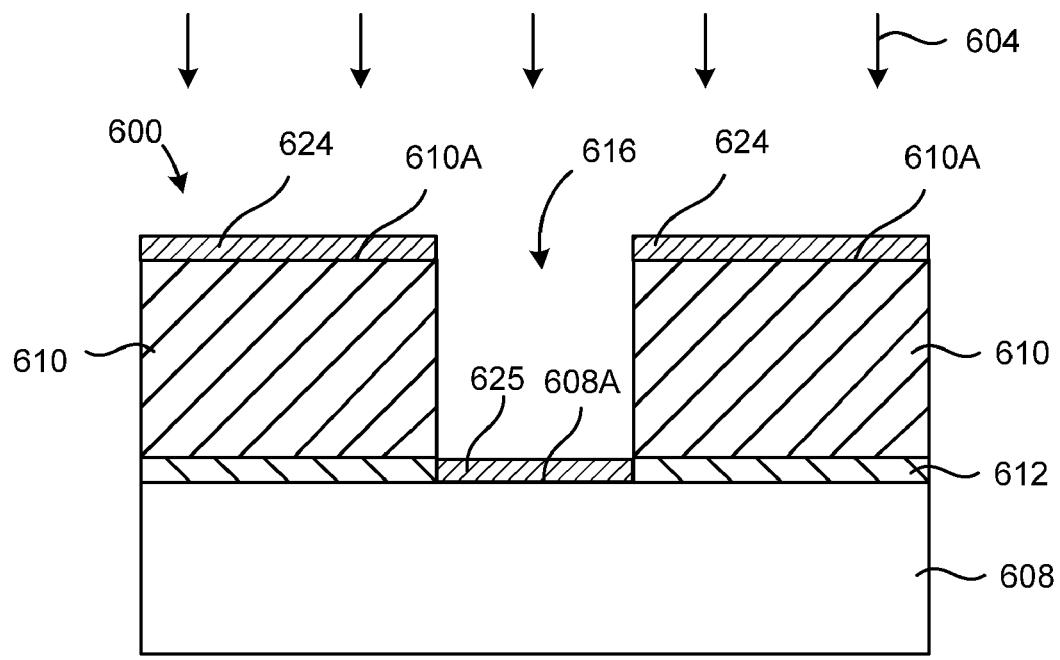
FIG. 6E is an illustration of the substrate in FIG. 6D after a non-selective film deposition by GCIB processing.

FIG. 6E is an illustration of the patterned substrate 600 in FIG. 6D after a non-selective film deposition by further GCIB processing with a GCIB 604. The further GCIB processing can include using the GCIB processing parameters for GCIB 603 in FIG. 6C. Exposure to the GCIB 604 non-selectively deposits a film 625 on the etched surface 608A in the recessed feature 616 and film 624 on the film deposition surface 610A. As depicted in FIG. 6E, little or no film may be deposited on the sidewalls in the recessed feature 616 due to the anisotropic nature of the GCIB 604.

Figure 6F:
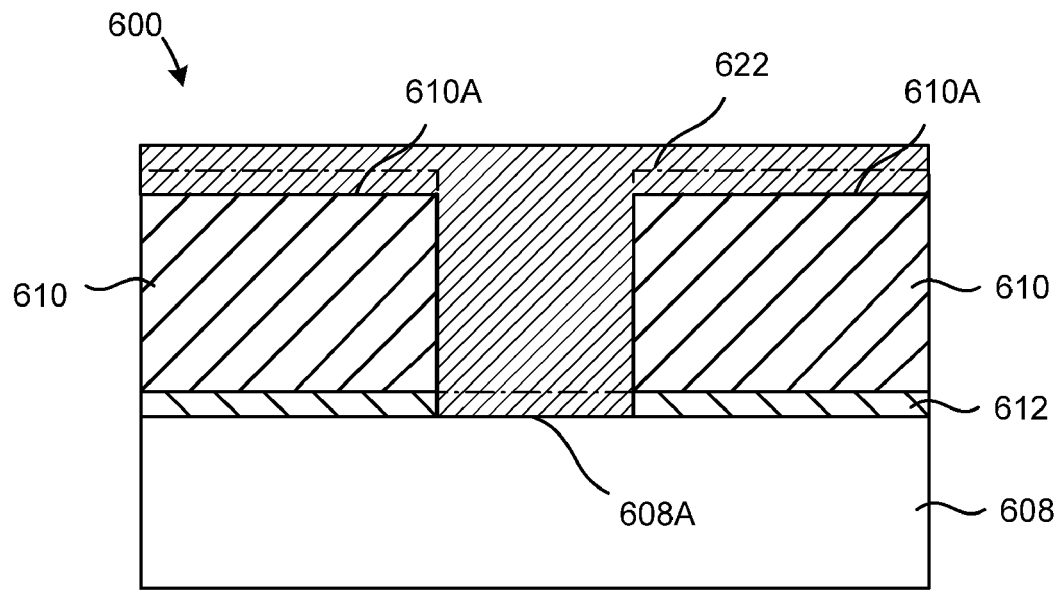
FIG. 6F is an illustration of the substrate in FIG. 6D after a non-selective thick film deposition by GCIB processing.

FIG. 6F is an illustration of the patterned substrate 600 in FIG. 6E after further non-selective film deposition by GCIB processing. The further non-selective GCIB processing may include longer exposure to the GCIB 604 described above in reference to FIG. 6E to fill the recessed feature 616 with a film 622.

In one example, a plurality of substrates containing different materials was exposed to GCIBs containing clusters of methylsilane deposition-etch gas. The different materials included Si, $SiO_2$, BDII (a SiCOH material), SiC, and SiCN. The GCIBs were formed from a pressurized gas flow of 700 sccm containing 10% methylsilane and 90% Ar, and using acceleration voltages of 20 keV or 30 keV. The GCIB doses were $1.90 \times 10^{15}$ and $2.4 \times 10^{15}$ atoms/$cm^2$ for the acceleration voltages of 20 keV and 30 keV, respectively. Post-GCIB exposure analysis of the plurality of substrates showed that the GCIBs exposures using acceleration voltages of 30 keV deposited thin films containing silicon and carbon on all the different materials. The thicknesses of the thin films deposited on the different materials were 44 nm (Si), 40 nm ($SiO_2$), 45 nm (BDII), 45 nm (SiC), and 35 nm (SiCN). However, GCIB exposures using the lower acceleration voltage of 20 keV only deposited thin films containing silicon and carbon on BDII but etched all the other materials. The thickness of the thin film deposited on BDII was 25 nm and the thicknesses etched from the other materials were 60 nm (Si), 30 nm ($SiO_2$), 60 nm (SiC), and 72 nm (SiCN). These results demonstrate that selective etching of many common materials used in semiconductor manufacturing relative to a SiCOH material may be achieved using a deposition-etch gas containing silicon and carbon in GCIB processing at acceleration voltages below 30 keV, for example 20 keV. It is speculated that an acceleration voltage of 30 keV or greater is sufficient to break molecular bonds in the methylsilane gas upon impinging on the substrates and thus deposit thin films containing silicon and carbon on all the different materials studied. On the other hand, an acceleration voltage of 20 keV may not be able to break the molecular bonds upon impinging on the substrates and deposit thin films, but resulting in sputtering (etching) of the non-SiCOH materials. It is further speculated that the BDII SiCOH material catalyzes breaking of the molecular bonds in the methylsilane gas at acceleration energies of 20 keV.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for selectively etching an area of a substrate, comprising:
    providing in a process chamber a substrate containing a first material having a film deposition surface and a second material having an etch surface;
    forming a gas cluster ion beam (GCIB) from a pressurized gas comprising a deposition-etch gas; and
    exposing the substrate to the GCIB to remove at least a portion of the second material from the etch surface and to deposit a thin film on the film deposition surface of the first material, wherein the gas clusters of the GCIB are accelerated by an acceleration voltage less than 30 keV.

2. The method of claim 1, wherein the first material comprises a SiCOH-containing dielectric material and the second material comprises a non-SiCOH material.

3. The method of claim 2, wherein the first material comprises a SiCOH material or a F-doped SiCOH material.

4. The method of claim 2, wherein the second material comprises single crystal silicon, polycrystalline silicon, amorphous silicon, silicon nitride, silicon carbide, or silicon carbonitride.

5. A method for selectively etching an area of a substrate, comprising:
    providing in a process chamber a substrate containing a first material having a film deposition surface and a second material having an etch surface;
    forming a gas cluster ion beam (GCIB) from a pressurized gas comprising a deposition-etch gas; and
    exposing the substrate to the GCIB to remove at least a portion of the second material from the etch surface and to deposit a thin film on the film deposition surface of the first material, wherein the deposition-etch gas and the thin film each comprise silicon (Si) and carbon (C).

6. The method of claim 5, wherein the deposition-etch gas comprises a Si—C bond.

7. The method of claim 6, wherein the deposition-etch gas comprises an alkyl silane, an alkane silane, an alkene silane, or an alkyne silane.

8. The method of claim 6, wherein the deposition-etch gas comprises methylsilane, dimethylsilane, trimethylsilane, tetramethylsilane, ethylsilane, diethylsilane, triethylsilane, or tetraethylsilane.

9. The method of claim 6, wherein the deposition-etch gas consists of methylsilane.

10. The method of claim 1, wherein the pressurized gas further comprises a nitrogen-containing gas.

11. The method of claim 1, wherein the pressurized gas further comprises $N_2$, $NH_3$, $NF_3$, $NO$, $N_2O$, or $NO_2$, or a combination of two or more thereof.

12. The method of claim 1, wherein the pressurized gas further comprises a noble gas.

13. The method of claim 5, wherein the deposition-etch gas further comprises an additional carbon-containing gas selected from $CO$, $CO_2$, a hydrocarbon-containing gas, a fluorocarbon-containing gas, or a hydrofluorocarbon-containing gas, or any combination of two or more thereof.

14. The method of claim 1, further comprising a recessed feature in the first material having a bottom and a sidewall, wherein the etch surface of the second material is located at the bottom of the recessed feature.

15. The method of claim 1, further comprising:
removing the thin film by wet processing or dry processing, the dry processing comprising a thermal process, a plasma-excited process, or a GCIB process.

16. A method for selectively etching areas of a substrate, comprising:
providing in a process chamber a substrate containing a SiCOH-containing dielectric material having a film deposition surface and a second material having an etch surface, the second material containing single crystal silicon, polycrystalline silicon, amorphous silicon, silicon nitride, silicon carbide, or silicon carbonitride;
forming a gas cluster ion beam (GCIB) from a pressurized gas comprising a deposition-etch gas containing silicon (Si), carbon (C), and a Si—C bond, wherein gas clusters in the GCIB are accelerated by an acceleration voltage less than 30 keV;
exposing the substrate to the GCIB to remove at least a portion of the second material from the etch surface and to deposit a thin film containing silicon and carbon on the film deposition surface of the dielectric material.

17. The method of claim 16, wherein the deposition-etch gas comprises methylsilane, dimethylsilane, trimethylsilane, tetramethylsilane, ethylsilane, diethylsilane, triethylsilane, or tetraethylsilane.

18. A method for selectively etching areas on a patterned substrate, comprising:
providing in a process chamber a patterned substrate containing a recessed feature having a bottom and a sidewall formed in a first material having a film deposition surface and a second material containing an etch surface at the bottom of the recessed feature;
forming a gas cluster ion beam (GCIB) from a pressurized gas comprising a deposition-etch gas containing silicon (Si) and carbon (C); and
exposing the patterned substrate to the GCIB to etch the second material from the etch surface and to deposit a thin film containing silicon and carbon on the film deposition surface.

19. A method for processing a substrate, comprising:
providing in a process chamber a substrate containing a first material having a film deposition surface and a second material having an etch surface;
selecting first gas cluster ion beam (GCIB) processing parameters for selectively etching the etch surface and for depositing a first film on the film deposition surface;
forming a first GCIB from a pressurized gas comprising a deposition-etch gas using the first GCIB processing parameters;
exposing the substrate to the first GCIB using the first GCIB processing parameters to remove at least a portion of the second material from the etch surface and to deposit the first film on the film deposition surface of the first material;
selecting second GCIB processing parameters for non-selectively depositing an additional film on the substrate;
forming a second GCIB using the second GCIB processing parameters; and
exposing the substrate to the second GCIB using the second GCIB processing parameters to deposit the additional film on the substrate,
wherein the deposition-etch gas, the first film, and the additional film each comprise silicon (Si) and carbon (C).

20. The method of claim 19, wherein the first material comprises a SiCOH-containing dielectric material and the second material comprises a non-SiCOH material.

21. The method of claim 19, further comprising:
prior to exposing the substrate to the second GCIB, removing the first film from the film deposition surface.

22. The method of claim 5, wherein the first material comprises a SiCOH-containing dielectric material and the second material comprises a non-SiCOH material.

23. The method of claim 22, wherein the second material comprises single crystal silicon, polycrystalline silicon, amorphous silicon, silicon nitride, silicon carbide, or silicon carbonitride.

* * * * *